US00RE40485E

(19) United States
(12) Reissued Patent
Hori et al.

(10) Patent Number: US RE40,485 E
(45) Date of Reissued Patent: Sep. 9, 2008

(54) SEMICONDUCTOR LIGHT-EMITTING ELEMENT

(75) Inventors: Yuji Hori, Nagoya (JP); Tomohiko Shibata, Kasugai (JP); Mitsuhiro Tanaka, Handa (JP); Osamu Oda, Nishikasugai-Gun (JP)

(73) Assignee: NGK Insulators, Ltd., Nagoya (JP)

(21) Appl. No.: 11/140,524

(22) Filed: May 27, 2005

Related U.S. Patent Documents

Reissue of:
(64) Patent No.: 6,573,535
Issued: Jun. 3, 2003
Appl. No.: 09/997,996
Filed: Nov. 30, 2001

(30) Foreign Application Priority Data

| | | |
|---|---|---|
| Dec. 4, 2000 | (JP) | 2000-367941 |
| Jan. 22, 2001 | (JP) | 2001-013432 |
| Mar. 26, 2001 | (JP) | 2001-087738 |
| Apr. 5, 2001 | (JP) | 2001-106576 |
| Oct. 22, 2001 | (JP) | 2001-322926 |

(51) Int. Cl.
*H01L 27/15* (2006.01)
*H01L 21/00* (2006.01)

(52) U.S. Cl. ..... 257/79; 257/13; 257/103; 257/E33.001; 257/E33.034; 438/22

(58) Field of Classification Search ..... 257/13, 257/79, 103, E33.001, E33.034; 438/22, 438/44
See application file for complete search history.

(56) References Cited

U.S. PATENT DOCUMENTS 5,075,742 A 12/1991 Gerard et al.
5,523,589 A * 6/1996 Edmond et al. ..... 257/77
5,684,309 A 11/1997 McIntosh et al.
5,963,787 A * 10/1999 Kimura et al. ..... 438/46
6,177,202 B1 * 1/2001 Takehara et al. ..... 428/515
6,177,292 B1 * 1/2001 Hong et al. ..... 438/46

FOREIGN PATENT DOCUMENTS

| | | |
|---|---|---|
| EP | 0 437 385 | 7/1991 |
| JP | 09-018053 | 1/1997 |
| JP | 09/064477 | 3/1997 |
| JP | 10-027923 | 1/1998 |
| JP | 10-079501 | 3/1998 |
| JP | 11-354839 | 12/1999 |
| JP | 11-354840 | 12/1999 |
| JP | 11-354842 | 12/1999 |
| JP | 11-3401147 | 12/1999 |
| JP | 2000-091703 | 3/2000 |

OTHER PUBLICATIONS

Damilano et al., "From visible to white light emission by GaN quantum dots on Si(111) substrate", American Institute of Physics, Applied Physics Letters, vol. 75, No. 7, Aug. 16, 1999, pp. 962–964.
Rouviére et al., "Preferential nucleation of GaN quantum dots at the edge of A1N threading dislocations", American Institute of Physics, Applied Physics Letters, vol. 75, No. 17, Oct. 25, 1999, pp. 2632–2634.

(Continued)

*Primary Examiner*—Long K. Tran
(74) *Attorney, Agent, or Firm*—Burr & Brown

(57) ABSTRACT

In a semiconductor light-emitting element, an underlayer is made of AlN layer, and a first cladding layer is made of an n-AlGaN layer. A light-emitting layer is composed of a base layer made of i-GaN and plural island-shaped single crystal portions made of i-AlGaInN isolated in the base layer. Then, at least one rare earth metal element is incorporated into the base layer and/or the island-shaped single crystal portions.

13 Claims, 3 Drawing Sheets

OTHER PUBLICATIONS

Hirayama et al., "Intense photoluminescence from self–assembling InGaN quantum dots artifically fabricated on AlGaN surfaces", American Institute of Physics, Applied Physics Letters, vol. 72, No. 14, Apr. 6, 1998, pp. 1736–1738.

Widmann et al., "Growth kinetics and optical properties of self–organized GaN quantum dots", American Institute of Physics, Journal of Applied Physics, vol. 83, No. 12, Jun. 15, 1998, pp. 7618–7624.

Ohba et al., "Growth of High–Quality AIN and AIN/GaN/AIN Heterostructure on Sapphire Substrate", Jpn. J. Appl. Phys., vol. 35 (1996), Part 2, No. 8B, Aug. 15, 1996, pp. L1013–L1015.

Yamamoto et al., "Nitridation effects of substrate on the metalorganic chemical vapor deposition growth of InN on Si an $\alpha$–$Al_2O_3$substrates", Journal of Crystal Growth, 137 (1994) Apr. Nos. 3/4, pp. 415–420.

* cited by examiner

SEMICONDUCTOR LIGHT-EMITTING ELEMENT

Matter enclosed in heavy brackets [ ] appears in the original patent but forms no part of this reissue specification; matter printed in italics indicates the additions made by reissue.

BACKGROUND OF THE INVENTION (1) Field of the Invention

This invention relates to a semiconductor light-emitting element, particularly usable for a white light-emitting diode.

(2) Related Art Statement

Recently, various light-emitting diodes (LEDs) are widely available. LEDs are expected for illuminating use as well as displaying use because of their low electric power consumption, long life time, $CO_2$ gas reduction originated from the reduction of the high energy consumption such as the low electric power consumption, and thus, much demand for the LEDs are expected.

As of now, the LEDs are made of various semi-conducting materials such as GaAs-based semi-conducting materials, AlGaAs-based semi-conducting materials, GaP-based semi-conducting materials, GaAsP-based semi-conducting materials and InGaAlP-based semi-conducting materials, and thus, can emit various color lights from red to yellow-green. Therefore, the LEDs are employed particularly for various displaying uses. Recently, blue and green LEDs have been realized by using GaN-based semi-conducting materials. As a result, selecting a given LED, a given color light from red to blue, that is, within visible light range, can be obtained from the LED, and full-color displaying is also realized. Moreover, white light-emitting diodes (white LEDs) are being realized by using RGB LED chips or using two color light-emitting diodes composed of blue LEDs with a yellow fluorescent substance thereon. As a result, LED illumination is being realized at present.

However, the white LED using the RGB LED chips requires higher cost because the plural LED chips are employed, so that in view of the cost, it is difficult to employ the white LED for illumination use. On the other hand, full color can not be recognized by the white LED using the two color light-emitting diode because it employs only two primary colors, not three primary colors. Moreover, in the white LED, the brightness of only about 25 lm/w can be realized, which is very small as compared with the brightness of 90 lm/W of a fluorescent tube.

Therefore, a white LED employing three primary colors is strongly desired all over the world because of the low energy consumption taking environmental problems into consideration. In reality, such a white LED is intensely developed by Japanese national professions and foreign major electric-manufacturing enterprises.

Such an attempt is made as to fabricate a white LED using three or more primary colors as illuminating a three primary colors-fluorescent substance by an ultraviolet LED. This attempt is fundamentally based on the same principle as a fluorescent tube, and employs the ultraviolet LED as the ultraviolet beam from the mercury discharge in the fluorescent tube. In this case, the cost of the white LED is increased because the three primary colors-fluorescent substance is additionally employed for the ultraviolet LED. Using a GaN-based semi-conducting material, a blue LED can be realized, and then, using the GaN-based semi-conducting material, the ultraviolet LED can be realized. However, the luminous efficiency of the resulting ultraviolet LED is largely reduced, as compared with the blue LED.

The luminescence reduction is considered as follows. If the GaN-based semiconductor film is epitaxially grown on a substrate made of e.g., a sapphire single crystal, much misfit dislocations are created at the boundary between the film and the substrate due to the difference in lattice constant between the film and the substrate. The misfit dislocations are propagated in the film and a light-emitting layer provided on the film, and thus, many dislocations are created in the resulting LED.

In a blue LED or a green LED made of GaN-based semi-conducting materials, the light-emitting layer is made of an InGaN semi-conducting material. In this case, the In elements are partially located, and thus, some carriers are located and confined. Therefore, the carriers are recombined before they are moved and seized at the dislocations, so that the LED can exhibit its sufficient luminous efficiency.

That is, even though many dislocations are created in the light-emitting layer, the carriers are recombined and thus, a given luminescence is generated before they are moved and seized at the dislocation as non-luminescence centers, so that the blue LED or the green LED using the GaN-based semi-conducting materials can exhibit their high luminous efficiency.

For fabricating an ultraviolet LED, the In ratio of the light-emitting layer must be reduced. Therefore, the In elements are not almost located, and thus, the diffusion length of a carrier is elongated. As a result, the carriers are easily moved at and recombined with the dislocations in the light-emitting layer. In this way, the luminous efficiency of the ultraviolet LED is reduced due to the large amount of dislocations in the light-emitting layer, as compared with the blue LED. In this point of view, various dislocation-reducing methods have been researched and developed.

For example, such an ELO technique is proposed as fabricating a strip mask made of $SiO_2$ during an epitaxial process and preventing the propagation of the misfit dislocations created at the boundary between the epitaxial film and a substrate. According to the ELO technique, a light-emitting layer having fewer dislocations can be formed above the substrate via strip mask. However, the ELO technique is a complicated means, so that the manufacturing cost is increased. Then, in the ELO technique, a thicker layer made of e.g., a GaN-based semi-conducting material is formed on the substrate, which results in being curved. Practically, in a device manufacturing process, when epitaxial films are formed on their respective substrates by the ELO technique, the better half of the substrates is broken. Therefore, it is difficult to employ the ELO technique in a practical device manufacturing process, particularly for LEDs.

In addition, an attempt is made to epitaxially grow a bulky GaN single crystal for reducing the dislocation density of the resulting device, for example by using a high pressure solution growth method, a vapor phase epitaxial growth method or a flux method. As of now, however, such a single crystal bulky enough to be applied for the device manufacturing process is not grown and prospected.

For fabricating a bulky GaN single crystal of low dislocation density, an attempt is made to grow a thicker GaN single crystal on a substrate made of an oxide to match in lattice the GaN single crystal by a HVPE method, and thereafter, remove the substrate, to obtain only the GaN single crystal to be used as a substrate. However, a GaN single crystal bulky enough to be industrially applied for LEDs has not yet been fabricated.

As a result, the high luminous efficiency in such a white LED as employing three or more primary colors through the illumination of a fluorescent substance by an ultraviolet LED is not technically prospected.

SUMMARY OF THE INVENTION

It is an object of the present invention to provide a new semiconductor light-emitting element preferably usable for a LED to emit an any color light regardless of the dislocation density, particularly a white LED.

For achieving the above object, this invention relates to a semi-conductor light-emitting element including a substrate, an underlayer, formed on the substrate, made of a first semi-conducting nitride material including at least one element selected from the group consisting of Al, Ga and In, a first conductive layer, formed on the underlayer, made of a second semi-conducting nitride material including at least one element selected from the group consisting of Al, Ga and In, a first cladding layer, formed on the first conductive layer, made of a third semi-conducting nitride material including at least one element selected from the group consisting of Al, Ga and In, a light-emitting layer composed of a base layer, formed on the first cladding layer, made of a fourth semi-conducting nitride material including at least one element selected from the group consisting of Al, Ga and In and plural isolated island-shaped single crystal portions, embedded in the base layer, made of a fifth semi-conducting nitride material including at least one element selected from the group consisting of Al, Ga and In and having an in-plane lattice constant larger than that of the third semi-conducting nitride material, a second cladding layer, formed on the light-emitting layer; made of a sixth semi-conducting nitride material including at least one element selected from the group consisting of Al, Ga and In, and a second conductive layer, formed on the second cladding layer, made of a seventh semi-conducting nitride material including at least one element selected from the group consisting of Al, Ga and In.

Then, the bandgap of the third semi-conducting nitride material constituting the first cladding layer, the bandgap of the fourth semi-conducting nitride material constituting the base layer and the bandgap of the fifth semi-conducting nitride material become larger by turns. That is, the relation of the bandgap of the third semi-conducting nitride material>the bandgap of the fourth semi-conducting nitride material>the bandgap of the fifth semi-conducting nitride material is satisfied. Moreover, at least one element selected from the group consisting of rare earth metal elements and transition metal elements is incorporated, as an additive element, into at least one of the base layer and the plural island-shaped single crystal portions, to generate and emit an any color light from the whole of the light-emitting layer.

Recently, such a LED as to be illuminated through a light-emitting layer having mismatched in lattice and isolated island-shaped single crystal portions have been intensely researched and developed. The inventors have paid attention to the potential performance of the semiconductor light-emitting element having the light-emitting layer with island-shaped single crystal portions, and made an attempt to realize the element by controlling the manufacturing condition.

Regardless of the above attempt, however, the semiconductor light-emitting element can not exhibit the practical luminescence intensity and a desired color light, particularly, a white color. Therefore, the inventors have conceived that at least one element selected from the group consisting of rare earth metal elements and transition metal elements is incorporated as an additive element into the at least one of the island-shaped single crystal portions and the base layer to cover and support the island-shaped portions which constitute the light-emitting layer.

When the rare earth metal elements and the transition metal elements are excited by an external energy, a given inherent wavelength light (fluorescent light) is emitted from each of the elements. Therefore, if a rare earth metal element or a transition metal element is incorporated into the island-shaped single crystals and/or the base layer constituting the light-emitting layer, a given inherent wavelength light (fluorescent light) is emitted from the element through the excitation of the light emitted from the island-shaped single crystal portions.

Accordingly, if a rare earth metal element or a transition metal element is appropriately selected, an any color light, particularly, a white light can be easily obtained by taking advantage of the fluorescent light of the rare earth element or the transition element. In view of easy excitation and easy creation of any color light through the inherent fluorescent light, a rare earth metal element is preferably used.

Moreover, if different rare earth metal elements, that is, Tm element to generate a blue color wavelength-region light, Er element to generate a green color wavelength-region light and Eu or Pr element to generate a red color wavelength-region are incorporated into the light-emitting layer, a white light can be obtained only through the superimposition of the fluorescent lights from the rare earth metal elements.

The above invention is realized on the vast and long term research and development as mentioned above.

This invention also relates to a semiconductor light-emitting element including a substrate, an underlayer, formed on the substrate, made of a first semi-conducting nitride material including at least one element selected from the group consisting of Al, Ga and In, a first conductive layer, formed on the underlayer, made of a second semi-conducting nitride material including at least one element selected from the group consisting of Al, Ga and In, a first cladding layer, formed on the first conductive layer, made of a third semi-conducting nitride material including at least one element selected from the group consisting of Al, Ga and In, a semi-conducting layer composed of a base layer, formed on the first cladding layer, made of a fourth semi-conducting nitride material including at least one element selected from the group consisting of Al, Ga and In and plural isolated island-shaped single crystal portions, embedded in the base layer, made of a fifth semi-conducting nitride material including at least one element selected from the group consisting of Al, Ga and In and having an in-plane lattice constant larger than that of the third semi-conducting nitride material, a second cladding layer, formed on the light-emitting layer, made of a sixth semi-conducting nitride material including at least one element selected from the group consisting of Al, Ga and In, and a second conductive layer, formed on the second cladding layer, made of a seventh semi-conducting nitride material including at least one element selected from the group consisting of Al, Ga and In. Then, the bandgap of the third semi-conducting nitride material constituting the first cladding layer, the bandgap of the fourth semi-conducting nitride material constituting the base layer and the bandgap of the fifth semi-conducting nitride material become larger by turns. That is, the relation of the bandgap of the third semi-conducting nitride material>the bandgap of the fourth semi-conducting nitride material>the bandgap of the fifth semi-conducting nitride material is satisfied. Moreover, at least one element selected from the group consisting of rare earth metal elements and transition metal elements is adsorbed, as an adsorbing element, onto at least one of the boundary between the base layer and the island-shaped single crystal portions and the boundary between the base layer and the first cladding layer.

For developing the luminescence-recombination probability of electron and electron hole in the island-shaped single crystal portions, it is required that the volume of each of the island-shaped single crystal portions is decreased as small as possible, and the electrons and the electron holes, flown from the outside, are confined in the island-shaped single crystal portions strongly. That is, as the volumes of the island-shaped single crystal portions are decreased, the luminescence probability is increased.

However, as the volume of the island-shaped single crystal portion is decreased, the surface area thereof is increased, so that the number of the dangling bond of the island-shaped single crystal portions is increased. The carriers of electrons and electron holes are recombined with the dangling bonds in non-luminescence, and thus, the absolute number of carriers to be recombined in luminescence is decreased.

Therefore, if, according to the second semiconductor light-emitting element, a rare earth metal element and/or a transition metal element is adsorbed at the boundary between the base layer and the island-shaped single crystal portions and/or the boundary between the base layer and the first cladding layer, and thus, the dangling bonds at the surfaces of the island-shaped single crystal portions are reduced, the recombination in non-luminescence can be reduced and a desired color light can be obtained at a sufficient efficiency.

The mode of the second semiconductor light-emitting element may be employed in isolation or combination with the mode of the above-mentioned first semiconductor light-emitting element. In the combination case, the fluorescent lights from the rare earth metal element and the transition element can be enhanced, and thus, a desired color light can be easily generated. Also, from the similar reason to the one of the first semiconductor light-emitting element, a rare earth metal element is preferably employed.

In the combination of the modes of the first and the second semi-conducting elements, it is desired that the kind of the additive element into the base layer or the like constituting the light-emitting layer is the same as the kind of the adsorbing element onto the boundary between the island-shaped single crystal portions and the base layer, or the like. In this case, a desired color light can be generated at a higher intensity.

Particularly, if, as adsorbing elements, the same Tm element to generate a blue color wavelength-region light, the same Er element to generate a green color wavelength-region light and the same Eu or Pr element to generate a red color wavelength-region light are employed as the additive elements, a white light can be easily generated at a higher intensity.

In the semiconductor light-emitting element of the present invention, the in-plane lattice constant of the fifth semi-conducting nitride material constituting the island-shaped single crystal portion is set to be larger than the in-plane lattice constant of the third semi-conducting nitride material constituting the first cladding layer. In this case, compression stress is affected on the fifth semi-conducting nitride material, which results in being shaped in a dot. That is, the island-shaped single crystal portions are formed on the compressive stress.

The bandgap arrangement in the third semi-conducting nitride material constituting the first cladding layer, the fourth semi-conducting nitride material constituting the base layer and the fifth semi-conducting nitride material constituting the island-shaped single crystal portions is required to confine the island-shaped single crystal portions energetically and emit a given wavelength light from each of the single crystal portions.

BRIEF DESCRIPTION OF THE DRAWINGS

For a better understanding of the present invention, reference is made to the attached drawings, wherein.

DESCRIPTION OF THE PREFERRED EMBODIMENTS

This invention will be described in detail with reference to the accompanying drawings.

Figure 1:
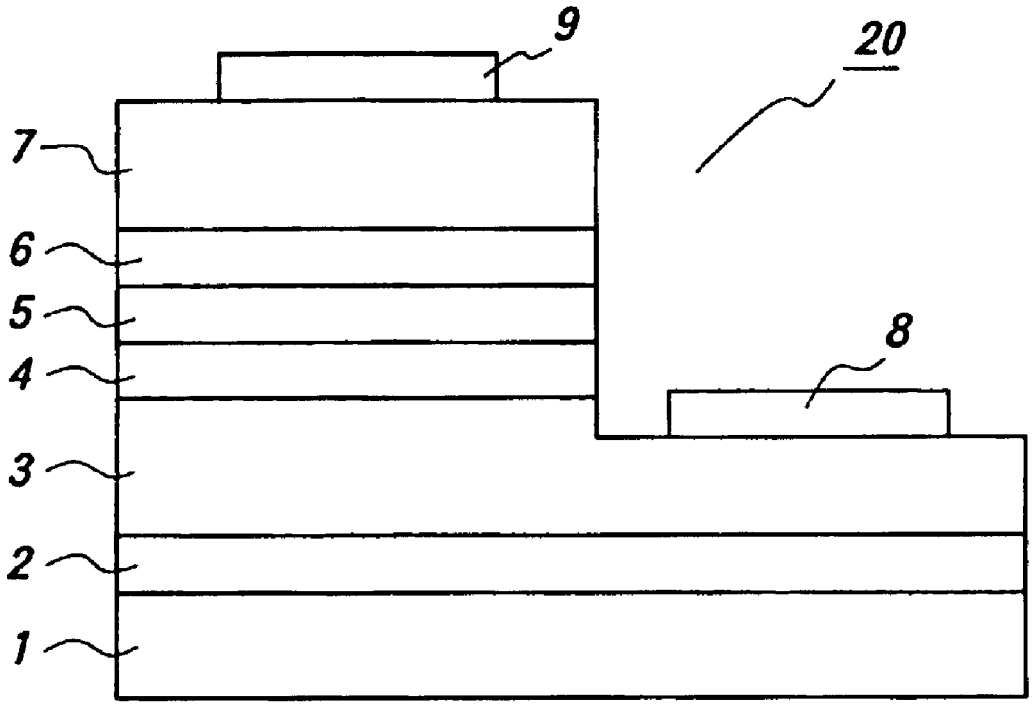
FIG. 1 is a cross sectional view showing a first semiconductor light-emitting element according to the present invention.

FIG. 1 is a cross sectional view showing a first semiconductor light-emitting element according to the present invention. A semiconductor light-emitting element 20 depicted in FIG. 1 includes a substrate 1, an underlayer 2 made of AlN as a first semi-conducting nitride material formed on the substrate 1, and a first conductive layer 3 made of n-AlGaN as a second semi-conducting nitride material formed on the underlayer 2. Moreover, the element 20 includes a first cladding layer 4 made of n-AlGaN as a third semi-conducting nitride material formed on the first conductive layer 3, a light-emitting layer 5 formed on the first cladding layer 4, and a second cladding layer 6 made of p-AlGaN as a sixth semi-conducting nitride material. Then, a second conductive layer 7 made of p-GaN as a seventh semi-conducting nitride material is provided on the second cladding layer 6.

The first conductive layer 3 is partially removed and exposed, and an n-type electrode 8 of Al/Pt is provided on the exposed surface of the first conductive layer 3. Then, a p-type electrode 9 of Au/Ni is provided on the second conductive layer 7.

Figure 2:
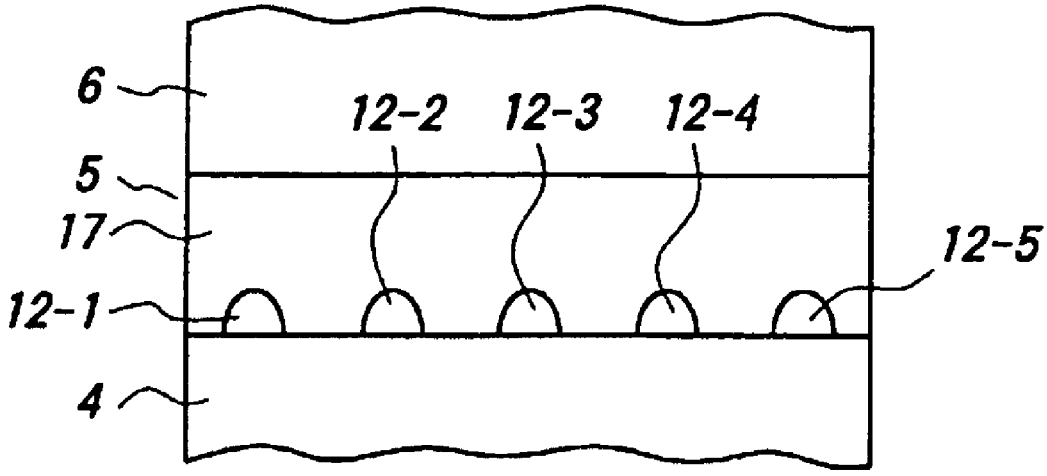
FIG. 2 is an enlarged view showing the light-emitting layer of a first semiconductor light-emitting element according to the present invention.

FIG. 2 is an enlarged view showing the light-emitting layer 5 of the first semiconductor light-emitting element 20. As is apparent from FIG. 2, the light-emitting layer 5 is composed of a base layer 17 made of i-GaN as a fourth semi-conducting nitride material and isolated island-shaped single crystal portions 12-1 through 12-5 made of i-AlGaInN as a fifth semi-conducting nitride material.

In FIGS. 1 and 2, for clarifying the characteristics of the semiconductor light-emitting element of the present invention, some constituting parts are different from the real ones.

It is required in the semiconductor light-emitting element 20 depicted in FIG. 1 that the in-plane lattice constant of the fifth semi-conducting nitride material constituting the island-shaped single crystal portions is set to be larger than the in-plane lattice constant of the third semi-conducting nitride material constituting the first cladding layer 4. Concretely, the difference in in-plane lattice constant between the semi-conducting nitride materials is set within 0.4–14%, particularly 2–8% by the ratio for the in-plane lattice constant of the first semi-conducting nitride material. In this case, the island-shaped single crystal portions can be easily formed by a normal MOCVD method.

Also, it is required that at least one of the base layer 17 and the island-shaped single crystal portions 12-1 through 12-5 which constitute the light-emitting layer 5 includes, as an additive element, at least one element selected from the group consisting of rare earth metal elements and transition metal elements. The content of the additive element is not restricted, but appropriately selected on the kind of the additive element, the material compositions of the fourth and the fifth semi-conducting nitride materials constituting the base layer and the island-shaped single crystal portions, and a desired luminescence intensity.

In the case of employing, as the fourth and the fifth semi-conducting nitride material, a semi-conducting nitride material including the at least one of Al element, Ga element and In element, the additive element is preferably incorporated as much as possible into the base layer or the like. Concretely, the additive elements may be incorporated within a range of 0.01–7 atomic percentages. In this case, regardless of the kind of rare earth metal element or transition metal element as the additive element, a given color light can be generated and emitted at a sufficient intensity of about 80 lm/W enough to be practically used.

As mentioned above, in view of easy excitation and easy creation of any color light through the inherent fluorescent light, a rare earth metal element is preferably used.

The kind of rare earth metal element is not restricted, but appropriately selected on the kind of a desired color light. As mentioned above, for example, Tm element may be employed to generate a blue color wavelength-region light, and Er element may be employed to generate a green color wavelength-region light, and Eu or Pr element may be employed to generate a red color wavelength-region light.

Therefore, if these rare earth metal elements are incorporated into the base layer 17 and/or the island-shaped single crystal portions 12-1 through 12-5, the blue color light, the green color light and the red color light are superimposed, thereby to generate and emit an any color light or a white light only through the fluorescent lights from the rare earth metal elements.

As the transition metal element, Fe element, Co element, Mn element, Ni element, Cu element and Zn element may be exemplified.

Figure 3:
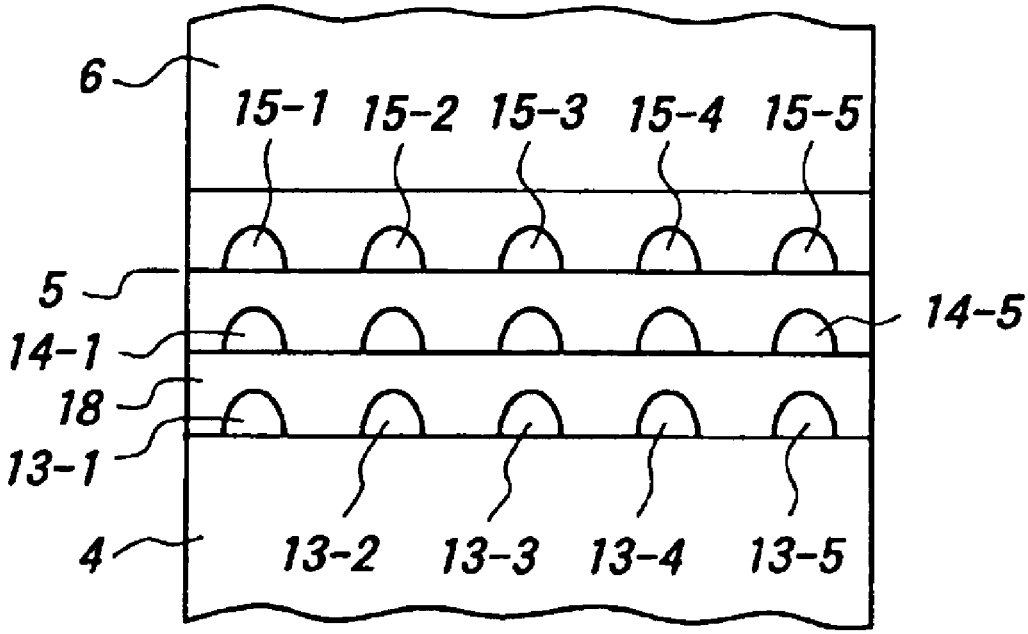
FIG. 3 is an enlarged view showing the light-emitting layer of another first semiconductor light-emitting element according to the present invention.

FIG. 3 is a schematic view showing a modified embodiment of the light-emitting layer shown in FIG. 2. In FIG. 3, the light-emitting layer 5 is composed of a base layer 18 and isolated island-shaped single crystal portions 13-1 through 13-5, 14-1 through 14-5 and 15-1 through 15-5 which are stepwisely formed.

A rare earth metal element is incorporated into the island-shaped single crystal portions formed stepwisely and/or the base layer 18 to support the island portions. In this case, a variety of rare earth metal elements can be incorporated appropriately, and thus, an any color light, particularly, a white light can be easily and precisely generated.

The additive element may be incorporated into the base layer and the island-shaped single crystal portions by irradiating molecular beam from a rare earth metal element source or a transition metal element source by a MBE method, at the same time when the island-shaped single crystal portions and the base layer are formed.

In the first semiconductor light-emitting element of the present invention, it is required that the semi-conducting nitride materials such as the first semi-conducting nitride material include at least one element selected from the group consisting of Al, Ga and In. In addition, the semi-conducting nitride materials may include an additive element such as Ge, Si, Mg, Zn, Be, P or B as occasion demands. Moreover, the semi-conducting nitride materials may include a minute impurity contained in the raw material gases and the reactor or contained dependent on the forming condition.

In the semiconductor light-emitting element of the present invention, the substrate may be made of an oxide single crystal such as sapphire single crystal, ZnO single crystal, $LiAlO_2$ single crystal, $LiGaO_2$ single crystal, $MgAl_2O_4$ single crystal, or MgO single crystal, IV single crystal or IV—IV single crystal such as Si single crystal or SiC single crystal, III–V single crystal such as GaAs single crystal, AlN single crystal, GaN single crystal or AlGaN single crystal, and boride single crystal such as $ZrB_2$.

Particularly, in the case of making the substrate of the sapphire single crystal, it is desired that a surface-nitriding treatment is performed on the main surface for the underlayer or the like to be formed. The surface-nitriding treatment is performed as follows. First of all, the sapphire single crystal substrate is set in a nitrogen-including atmosphere such as an ammonia atmosphere, and then, heated for a given period. The thickness of the resulting surface nitride layer can be adjusted by controlling the nitrogen concentration, the nitriding temperature and the nitriding period appropriately.

If the sapphire single crystal substrate having the surface nitriding layer thereon is employed, the crystallinity of the underlayer formed directly on the main surface can be more enhanced. As a result, the crystallinities of the conductive layers, the cladding layers and the light-emitting layer can be more enhanced, and thus, the luminescence efficiency of the resulting semiconductor light-emitting element can be improved.

It is desired that the surface-nitriding layer is formed thicker, for example, so that the nitrogen content of the sapphire single crystal substrate at the depth of 1 nm from the main surface is set to five atomic percentages or over, in ESCA analysis.

In such a semiconductor light-emitting element as shown in FIG. 1 according to the present invention, the underlayer, the first conductive layer and the light-emitting layer may be formed by a normal MOCVD method or the like only if the above-mentioned requirements are satisfied.

Figure 4:
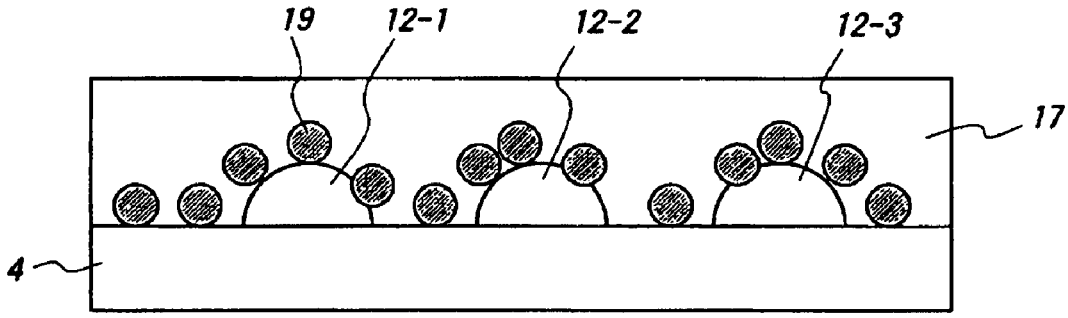
FIG. 4 is an enlarged view showing the light-emitting layer of a second semiconductor light-emitting element according to the present invention.

Next, a second semiconductor light-emitting element according to the present invention will be described. FIG. 4 is an enlarged view showing the light-emitting layer of the second semiconductor light-emitting element. The same reference numerals are given to the similar constituting parts to the ones shown in FIGS. 1–3. For clarifying the characteristics of the second semiconductor light-emitting element, in FIG. 4, some constituting parts are depicted, different from the real ones.

The second semiconductor light-emitting element has a similar configuration to the one of the first semiconductor light-emitting element shown in FIG. 1. The light-emitting layer 5 of the second semiconductor light-emitting element is, as shown FIG. 4, composed of a base layer 17 made of i-GaN and plural island-shaped single crystal portions 12-1 through 12-3 made of i-AlGaN. At least one element 19 selected from the group consisting of rare earth metal elements and transition metal elements is adsorbed onto the boundary between the island-shaped single crystal portions 12-1 through 12-3 and the base layer 17 and the boundary between the base layer 17 and the first cladding layer 4, according to the present invention.

The kind of the adsorbing element 19 is not restricted only if the number of the dangling bond is reduced by the adsorbing element. On the other hand, since the adsorbing element 19 is located in the light-emitting layer 5, it is excited by an injecting current and thus, emits a given fluorescent light.

That is, a given light on which the fluorescent light is superimposed is emitted from the whole of the light-emitting layer 5. Therefore, since the fluorescent light constitutes the light emitted from the light-emitting element, the adsorbing element 19 is appropriately selected so that a desired color light can be obtained. In view of easy excitation and easy creation of any color light through the inherent fluorescent light, a rare earth metal element is preferably used.

A rare earth metal element or a transition metal element may be selected as well as the first semiconductor light-emitting element. Particularly, Tm element may be employed to generate a blue color wavelength-region light, and Er element may be employed to generate a green color wavelength-region light, and Eu or Pr element may be employed to generate a red color wavelength-region light. Selecting these elements appropriately, a white light can be generated and emitted from the light-emitting layer 5.

In the second semiconductor light-emitting element of the present invention, it is required that the semi-conducting nitride materials such as the first semi-conducting nitride material include at least one element selected from the group consisting of Al, Ga and In. In addition, the semi-conducting nitride materials may include an additive element such as Ge, Si, Mg, Zn, Be, P or B as occasion demands. Moreover, the semi-conducting nitride materials may include a minute impurity contained in the raw material gases and the reactor or contained dependent on the forming condition.

Moreover, the substrate may be made of a sapphire single crystal, etc., as well as the first semiconductor light-emitting element. In the case of making the substrate of the sapphire single crystal, the sapphire single crystal substrate is set into a nitrogen-including atmosphere such as an ammonia atmosphere, and then, heated for a given period, to nitride the surface of the single crystal substrate. It is desired that the surface-nitriding layer is formed thicker, for example, so that the nitrogen content of the sapphire single crystal substrate at the depth of 1 nm from the main surface is set to five atomic percentages or more, in ESCA analysis.

In the combination of the mode of the first semiconductor light-emitting element and the mode of the second semiconductor light-emitting element, at least one element selected from the group consisting of rare earth metal elements and transition metal elements is incorporated, as an additive element, into the base layer 17 and/or the island-shaped single crystal portions 12-1 through 12-3 which constitute the light-emitting layer 5 shown in FIG. 4. In this case, by the synergy effect of the adsorbing element 19 and the additive element, an any color light, particularly, a white light can be easily generated and emitted.

If the adsorbing element and the additive element are composed of the same element, an any color light, particularly a white light can be generated and emitted at a higher intensity.

The additive element may be incorporated into the base layer and the island-shaped single crystal portions by irradiating molecular beam from a rare earth metal element source or a transition metal element source by a MBE method, at the same time when the island-shaped single crystal portions and the base layer are formed.

EXAMPLE

Example 1

A sapphire single crystal substrate having a diameter of 2 inches and a thickness of 430 μm was employed, and thus, pre-treated by $H_2SO_4$+$H_2O_2$, and set into a MOCVD apparatus. To the MOCVD apparatus was attached a gas system of $NH_3$, TMA, TMG and $SiH_4$. Then, the substrate was heated to 1200° C., and an ammonia gas ($NH_3$) was flown with a $H_2$ carrier gas for five minutes, to nitride the main surface of the substrate. In ESCA analysis, it was turned out that a surface-nitriding layer was formed on the main surface by the surface-nitriding treatment, and the nitrogen content at the depth of 1 nm from the main surface was seven atomic percentages.

Then, TMA and $NH_3$ were flown at an average rate of 10 m/sec, with flowing $H_2$ gas at 10 m/sec, to form an AlN film in a thickness of 1 μm as an underlayer. The full width at half maximum in X-ray rocking curve of the AlN film was 90 seconds, and thus, the good crystallinity of the AlN film was confirmed.

Then, for protecting the AlN film, TMG and $HN_3$ were flown at an average rate of 10 m/sec, to form a GaN film in a thickness of 100 Å on the AlN film. Thereafter, the substrate having the AlN film and the GaN film was taken out of the MOCVD apparatus, and then, set into a MBE apparatus.

To the MBE apparatus were attached a solid raw material system of 7N-Ga, 7N-In, 6N-Al, 3N-Er, 3N-Tm, 3N-Pr, 3N-Eu and a nitrogen gas system of atomic nitrogen gas generated by the high frequency plasma-generating apparatus from SVTA Co. Ltd. Moreover, to the MBE apparatus were attached a Si doping system and a Mg doping system so as to dope the n-type dopant Si and the p-type dopant Mg, respectively.

First of all, the substrate was heated to 900° C., and $H_2$ and $NH_3$ were flown, to remove the GaN film as a protective layer. Thereafter, the substrate was heated to 1000° C. and held for 30 minutes, to flatten the surface of the AlN film, and a Si-doped n-AlGaN layer as a first conductive layer was formed in a thickness of 1 μm at 750° C.

Then, a Si-doped n-$Al_{0.2}Ga_{0.8}N$ layer was formed, as a first cladding layer, in a thickness of 1 μm on the n-AlGaN layer at 780° C. Thereafter, island-shaped single crystal portions, to constitute a light-emitting layer, were made of $In_{0.1}Ga_{0.9}N$ in a thickness (height) of 200 Å and an average diameter of 100 Å at 700° C. Then, an GaN layer as a base layer, to constitute the light-emitting layer, was formed in a thickness of 200 Å at 750° C., so as to embed the isolated island-shaped single crystal portions.

Then, a Mg-doped p-$Al_{0.2}Ga_{0.8}N$ layer was formed, as a second cladding layer, in a thickness of 50 Å on the GaN film at 780° C., and finally, a Mg-doped p-GaN layer was formed, as a second conductive layer, in a thickness of 2000 Å at 780° C.

Thereafter, the resulting multi-layered structure was partially removed, to expose partially the first conductive layer of the Si-doped n-AlGaN layer. Then, a p-type electrode of Au/Ni was provided on the second conductive layer of the Mg-doped p-GaN layer, and an n-type electrode of Al/Ti was provided on the exposed surface of the first conductive layer.

Thereafter, when a voltage of 3.5V was applied between the p-type electrode and the n-type electrode, to flow a current of 20 mA through the thus obtained semiconductor light-emitting element, a white light was emitted from the element at a high luminous efficiency of 80 lm/W.

Example 2

Except that the island-shaped single crystal portions were formed of Er, Tm, Pr and Eu doped $In_{0.1}Ga_{0.9}N$ in a thickness of 20 Å and a diameter of 100 Å, and thereafter, Eu, Er, Tm elements were irradiated and adsorbed at the boundary between the island-shaped single crystal portions and the first cladding layer as an underlayer through the molecular beam irradiation from their respective solid raw material sources, a semiconductor light-emitting element was fabricated in the same manner as Example 1.

Then, when a voltage of 3.5V was applied between the p-type electrode and the n-type electrode and thus, a current of 20 mA was flown through the semiconductor light-emitting element, a white light was generated and emitted from the semiconductor light-emitting element at a luminescence efficiency of 100 lm/W.

As is apparent from Examples 1 and 2, it is confirmed that the semiconductor light-emitting element of the present invention is usable as a practical white LED. In Example 2 where rare earth metal elements such as Er are adsorbed at the boundary between the island-shaped single crystal portions and the first cladding layer, in addition that the rare earth metal elements such as Er are incorporated into the island-shaped single crystals, the luminescence efficiency of the white light emitted is increased.

Although the present invention was described in detail with reference to the above examples, this invention is not limited to the above disclosure and every kind of variation and modification may be made without departing from the scope of the present invention.

For example, in the semiconductor light-emitting elements shown in FIG. 1 and Examples, the lower side layers from the light-emitting layer are made of n-type semi-conducting materials, and the upper side layers from the light-emitting layer are made of p-type semi-conducting materials, but the other way around will do. Moreover, in FIG. 3, although the island-shaped single crystal portions are formed in three steps, they may be formed in two steps or four or more steps.

Moreover, the semiconductor light-emitting element may include a quantum well structure. Then, although, in the Examples, the AlGaN conductive layer or the like were formed directly on the AlN underlayer, they may be formed on a buffer layer or multi-layered stacking films e.g., constituting a distorted superlattice structure which is provided on the substrate by a given forming condition such as the forming temperature, the flow rate of raw material gas, the forming pressure, the amount of raw material gas and the amount of additive material gas.

As mentioned above, in the semiconductor light-emitting element of the present invention, the light-emitting layer is composed of isolated island-shaped single crystal portions and a base layer to support the island portions, and at least one element selected from the group consisting of rare earth metal elements and transition metal elements is incorporated into the island portions and/or the base layer. In addition, as occasion demands, at least one element selected from the group consisting of rare earth metal elements and transition metal elements is adsorbed at the boundary between the island-shaped single crystal portions and the base layer and/or the boundary between the single crystal portions and the first cladding layer.

Therefore, adjusting the kinds of such additive elements and/or adsorbing elements appropriately, an any color light, particularly, a white light can be generated and emitted from the semiconductor light-emitting element at a practical luminescence efficiency.

What is claimed is:

1. A semiconductor light-emitting element comprising:

a substrate, an underlayer, formed on the substrate, made of a first semi-conducting nitride material including at least one element selected from the group consisting of Al, Ga and In, a first conductive layer, formed on the underlayer, made of a second semi-conducting nitride material including at least one element selected from the group consisting of Al, Ga and In, a first cladding layer, formed on the first conductive layer, made of a third semi-conducting nitride material including at least one element selected from the group consisting of Al, Ga and In, a light-emitting layer composed of a base layer, formed on the first cladding layer, made of a fourth semi-conducting nitride material including at least one element selected from the group consisting of Al, Ga and In and plural isolated island-shaped single crystal portions, embedded in the base layer, made of a fifth semi-conducting nitride material including at least one element selected from the group consisting of Al, Ga and In and having an in-plane lattice constant larger than that of the third semi-conducting nitride material, a second cladding layer, formed on the light-emitting layer, made of a sixth semi-conducting nitride material including at least one element selected from the group consisting of Al, Ga and In, and a second conductive layer, formed on the second cladding layer, made of a seventh semi-conducting nitride material including at least one element selected from the group consisting of Al, Ga and In,

[the bandgap of the third semi-conducting nitride material constituting the first cladding layer,] the bandgap of the fourth semi-conducting nitride material constituting the base layer and the bandgap of the fifth semi-conducting nitride material becoming larger by turns to satisfy the following relationship: [the bandgap of the third semi-conducting nitride material >] the bandgap of the fourth semi-conducting nitride material > the bandgap of the fifth semi-conducting material, at least one element selected from the group consisting of rare earth metal elements and transition metal elements being incorporated, as an additive element, into at least one of the base layer and the plural island-shaped single crystal portions, to generate and emit an any color light from the whole of the light-emitting layer.

2. A semiconductor light-emitting element as defined in claim 1, wherein the difference in in-plane lattice constant between the third semi-conducting nitride material constituting the first cladding layer and the fifth semi-conducting nitride material constituting the island-shaped single crystal portions is set within 0.4–14% by the ratio for the in-plane lattice constant of the first semi-conducting nitride material.

3. A semiconductor light-emitting element as defined in claim 1, wherein the content of the additive element is set within 0.01–7 atomic percentages.

4. A semiconductor light-emitting element as defined in claim 1, wherein a first rare earth element to generate a blue color wavelength-region light, a second rare earth element to generate a green color wavelength-region light and a third rare earth element to generate a red color wavelength-region light are incorporated, as additive elements, into at least one of the base layer and the plural island-shaped single crystal portions.

5. A semiconductor light-emitting element as defined in claim 1, wherein the plural island-shaped single crystal portions are formed stepwisely in the base layer.

6. A semiconductor light-emitting element as defined in claim 1, wherein at least one element selected from the group consisting of rare earth metal elements and transition metal elements is adsorbed, as an adsorbing element, onto at least one of the boundary between the base layer and the island-shaped single crystal portions and the boundary between the base layer and the first cladding layer.

7. A semiconductor light-emitting element as defined in claim 6, wherein a first rare earth element to generate a blue color wavelength-region light, a second rare earth element to separate a green color wavelength-region light and a third rare earth element to generate a red color wavelength-region light are adsorbed, as adsorbing elements, onto at least one of the boundary between the base layer and the island-shaped single crystal portions and the boundary between the base layer and the first cladding layer.

8. A semiconductor light-emitting element comprising:

a substrate, an underlayer, formed on the substrate, made of a first semi-conducting nitride material including at least one element selected from the group consisting of Al, Ga and In, a first conductive layer, formed on the underlayer, made of a second semi-conducting nitride material including at least one element selected from the group consisting of Al, Ga and In, a first cladding layer, formed on the first conductive layer, made of a third semi-conducting nitride material including at least one element selected from the group consisting of Al, Ga and In, a light-emitting layer composed of a base layer, formed on the first cladding layer, made of a fourth semi-conducting nitride material including at least one element selected from the group consisting of Al, Ga and In and plural isolated island-shaped single crystal portions, embedded in the base layer, made of a fifth semi-conducting nitride material including at least one element selected from the group consisting of Al, Ga and In and having an in-plane lattice constant larger than that of the third semi-conducting nitride material, a second cladding layer, formed on the light-emitting layer, made of a sixth semi-conducting nitride material including at least one element selected from the group consisting of Al, Ga and In, and a second conductive layer, formed on the second cladding layer, made of a seventh semi-conducting nitride material including at least one element selected from the group consisting of Al, Ga and In,

[the bandgap of the third semi-conducting nitride material constituting the first cladding layer,] the bandgap of the fourth semi-conducting nitride material constituting the base layer and the bandgap of the fifth semi-conducting nitride material becoming larger by turns to satisfy the following relationship: [the bandgap of the third semi-conducting nitride material >] the bandgap of the fourth semi-conducting nitride material > the bandgap of the fifth semi-conducting nitride material, at least one element selected from the group consisting of rare earth metal elements and transition metal elements being adsorbed, as an adsorbing element, onto at least one of the boundary between the base layer and the island-shaped single crystal portions and the boundary between the base layer and the first cladding layer.

9. A semiconductor light-emitting element as defined in claim 8, wherein the difference in in-plane lattice constant between the third semi-conducting nitride material constituting the first cladding layer and the fifth semi-conducting nitride material constituting the island-shaped single crystal portions is set within 0.4–14% by the ratio for the in-plane lattice constant of the first semi-conducting nitride material.

10. A semiconductor light-emitting element as defined in claim 8, wherein a first rare earth element to generate a blue color wavelength-region light, a second rare earth element to generate a green color wavelength-region light and a third rare earth element to generate a red color wavelength-region light are adsorbed as adsorbing elements, onto at least one of the boundary between the base layer and the island-shaped single crystal portions and the boundary between the base layer and the first cladding layer.

11. A semiconductor light-emitting element as defined in claim 8, wherein the plural island-shaped single crystal portions are formed stepwisely in the base layer.

*12. A semiconductor light-emitting element as defined in claim 1, wherein the bandgap of the third semi-conducting nitride material > the bandgap of the fourth semi-conducting nitride material.*

*13. A semiconductor light-emitting element as defined in claim 8, wherein the bandgap of the third semi-conducting nitride material > the bandgap of the fourth semi-conducting nitride material.*

* * * * *

UNITED STATES PATENT AND TRADEMARK OFFICE

CERTIFICATE OF CORRECTION

PATENT NO. : RE 40,485 E
APPLICATION NO. : 11/140524
DATED : September 9, 2008
INVENTOR(S) : Yuji Hori et al.

It is certified that error appears in the above-identified patent and that said Letters Patent is hereby corrected as shown below:

Title Page

*Item (56), Foreign Patent Documents:* please change "JP 11-3401147" to --JP 11-340147--

Please add: (*) Notice- This patent is subject to a terminal disclaimer.

Signed and Sealed this

Ninth Day of December, 2008

JON W. DUDAS
*Director of the United States Patent and Trademark Office*